US010573833B2

(12) United States Patent
Chen et al.

(10) Patent No.: US 10,573,833 B2
(45) Date of Patent: Feb. 25, 2020

(54) FLEXIBLE DISPLAY SUBSTRATE AND METHOD FOR MANUFACTURING THE SAME, AND FLEXIBLE DISPLAY DEVICE

(71) Applicant: BOE TECHNOLOGY GROUP CO., LTD., Beijing (CN)

(72) Inventors: Liqiang Chen, Beijing (CN); PaoMing Tsai, Beijing (CN); Jianwei Li, Beijing (CN); Dejun Bu, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/176,919

(22) Filed: Oct. 31, 2018

(65) Prior Publication Data

US 2019/0148653 A1 May 16, 2019

(30) Foreign Application Priority Data

Nov. 13, 2017 (CN) .......................... 2017 1 1116612

(51) Int. Cl.

| | |
|---|---|
| ***H01L 51/00*** | (2006.01) |
| ***H01L 27/32*** | (2006.01) |
| ***H01L 51/52*** | (2006.01) |
| ***G06F 3/041*** | (2006.01) |
| ***H01L 51/56*** | (2006.01) |
| *G02F 1/1333* | (2006.01) |
| *G06F 3/044* | (2006.01) |

(52) U.S. Cl.
CPC ........ *H01L 51/0097* (2013.01); *G06F 3/0412* (2013.01); *H01L 27/323* (2013.01); *H01L 27/3276* (2013.01); *H01L 51/5256* (2013.01); *H01L 51/56* (2013.01); *G02F 1/133305* (2013.01); *G06F 3/0445* (2019.05); *G06F 2203/04102* (2013.01); *G06F 2203/04103* (2013.01)

(58) Field of Classification Search
CPC ............. H01L 51/0097; H01L 27/3276; H01L 51/5256; H01L 51/56; G06F 3/0412; G06F 2203/04102
See application file for complete search history.

(56) References Cited

U.S. PATENT DOCUMENTS

2015/0055051 A1* 2/2015 Osawa ................ H01L 27/1225 349/48
2017/0338442 A1* 11/2017 Ishida ....................... G09F 9/30

* cited by examiner

*Primary Examiner* — Abbas I Abdulselam
(74) *Attorney, Agent, or Firm* — McDermott Will & Emery LLP

(57) ABSTRACT

A flexible display substrate includes a flexible base substrate, and a plurality of conductive terminals and a stress relief layer which are arranged sequentially on the flexible base substrate and disposed in a bonding region of the flexible base substrate. The bonding region includes Pad regions. The stress relief layer is provided with via holes on positions corresponding to the Pad regions respectively, and the via holes are used for exposing conductive surfaces of the conductive terminals respectively. The conductive surfaces are used for bonding an IC.

19 Claims, 7 Drawing Sheets

40
10
50
30
20

FLEXIBLE DISPLAY SUBSTRATE AND METHOD FOR MANUFACTURING THE SAME, AND FLEXIBLE DISPLAY DEVICE

CROSS-REFERENCE TO RELATED APPLICATION

This application claims priority to Chinese Patent Application No. 201711116612.7, filed on Nov. 13, 2017, titled "A FLEXIBLE DISPLAY SUBSTRATE AND METHOD FOR MANUFACTURING THE SAME, AND FLEXIBLE DISPLAY DEVICE", which is incorporated herein by reference in its entirety.

TECHNICAL FIELD

The present disclosure relates to the field of display technologies, and in particular, to a flexible display substrate and a method for manufacturing the same, and a flexible display device.

BACKGROUND

In recent years, flexible display substrates have become more and more widely used in electronic devices owing to their advantages of good impact resistance, light weight and thinning and the like. A display device using the flexible display substrate is for example a liquid crystal display (LCD) device, an organic light-emitting display (OLED) device, an electrophoretic display device or the like.

SUMMARY

A first aspect of the present disclosure provides a flexible display substrate, and the flexible display substrate includes a flexible base substrate, and a plurality of conductive terminals and a stress relief layer which are arranged sequentially on the flexible base substrate. The plurality of conductive terminals and the stress relief layer are disposed in a bonding region of the flexible display substrate. The bonding region includes Pad regions, and the stress relief layer is provided with via holes on positions corresponding to the Pad regions. Each via hole is used for exposing a conductive surface of a corresponding conductive terminal, and the conductive surface is used for bonding an IC.

In some embodiments, the flexible display substrate is divided into a display region and a non-display region located around the display region, and the bonding region is located in the non-display region. The flexible display substrate further includes metal wirings disposed in the display region, and the conductive terminals are connected to the metal wirings.

In some embodiments, a material of the stress relief layer includes an inorganic material.

In some embodiments, the inorganic material includes at least one of silicon nitride, silicon oxide or silicon oxynitride.

In some embodiments, a thickness of the stress relief layer ranges from 0.1 μm to 1.0 μm.

In some embodiments, the flexible display substrate further includes an encapsulation layer. The encapsulation layer includes at least one thin film layer, and the stress relief layer and at least one thin film layer in the encapsulation layer are in a same layer and of a same material.

In some embodiments, the encapsulation layer includes a first inorganic layer, a second inorganic layer and an organic layer disposed between the first inorganic layer and the second inorganic layer, and the stress relief layer and the first inorganic layer or the second inorganic layer are in a same layer and of a same material.

In some embodiments, the encapsulation layer includes a first inorganic layer, a second inorganic layer and an organic layer disposed between the first inorganic layer and the second inorganic layer, and the stress relief layer includes a first stress relief sub-layer and a second stress relief sub-layer stacked on one another. The first stress relief sub-layer and the first inorganic layer are in a same layer and of a same material, and the second stress relief sub-layer and the second inorganic layer are in a same layer and of a same material.

In some embodiments, the flexible display substrate further includes a planarization layer and a touch layer disposed on the planarization layer, and the touch layer includes a first touch electrode layer, a second touch electrode layer and an insulation layer disposed between the first touch electrode layer and the second touch electrode layer. The stress relief layer and the planarization layer or the insulation layer are in a same layer and of a same material.

In some embodiments, the flexible display substrate further includes a planarization layer and a touch layer disposed on the planarization layer, and the touch layer includes a first touch electrode layer, a second touch electrode layer and an insulation layer disposed between the first touch electrode layer and the second touch electrode layer. The stress relief layer includes a first stress relief sub-layer and a second stress relief sub-layer stacked on one another. The first stress relief sub-layer and the planarization layer are in a same layer and of a same material, and the second stress relief sub-layer and the insulation layer are in a same layer and of a same material.

In some embodiments, the flexible display substrate further includes a first connection pattern disposed on a side of the conductive terminal away from the flexible base substrate, and the first connection pattern includes a plurality of first connection portions. Each first connection portion is connected to a corresponding conductive terminal. The first connection pattern and the first touch electrode layer or the second touch electrode layer are in a same layer and of a same material.

In some embodiments, the flexible display substrate further includes a first connection pattern disposed on a side of the conductive terminal away from the flexible base substrate, and the first connection pattern includes a plurality of first connection portions. Each first connection portion is connected to a corresponding conductive terminal. The first connection pattern includes a first connection sub-pattern and a second connection sub-pattern that are stacked. The first connection sub-pattern and the first touch electrode layer are in a same layer and of a same material, and the second connection sub-pattern and the second touch electrode layer are in a same layer and of a same material.

In some embodiments, the flexible display substrate further includes a second connection pattern disposed between the conductive terminal and the stress relief layer, and the second connection pattern includes a plurality of second connection portions. Each second connection portion is electrically connected to a corresponding conductive terminal.

In some embodiments, the flexible display substrate includes gate lines and data lines. The metal wirings are the gate lines, the conductive terminals and the gate lines are in a same layer and of a same material, and the second connection pattern and the data lines are in a same layer and of a same material. Alternatively, the metal wirings are the data lines, the conductive terminals and the data lines are in a same layer and of a same material, and the second connection pattern and the gate lines are in a same layer and of a same material.

A second aspect of the present disclosure provides a flexible display device, including the above flexible display substrate and an IC. The IC has IC bumps, and the IC bumps contact conductive surfaces of conductive terminals of the flexible display substrate respectively.

In some embodiments, an orthographic projection of each IC bump on the flexible base substrate is within a range of an orthographic projection of a border of a corresponding via hole of the stress relief layer on the flexible base substrate.

A third aspect of the present disclosure provides a method for manufacturing the flexible display substrate described in the first aspect, and the flexible display substrate has a bonding region, which includes Pad regions. The method includes: forming a plurality of conductive terminals located in the bonding region on the flexible base substrate; and forming a stress relief layer located in the bonding region on the flexible base substrate on which the conductive terminals have been formed. The stress relief layer is provided with via holes on positions corresponding to the Pad regions. Each via hole is used for exposing a conductive surface of a corresponding conductive terminal, and the conductive surface is used for bonding an IC.

In some embodiments, forming the stress relief layer includes: forming a first inorganic layer and a first stress relief sub-layer covering the plurality of conductive terminals via at least one patterning process on the flexible base substrate on which the conductive terminals have been formed; forming an organic layer via a single patterning process on the first inorganic layer; and forming a second inorganic layer and a second stress relief sub-layer covering the plurality of conductive terminals via at least one patterning process on the organic layer. The stress relief layer includes the first stress relief sub-layer and/or the second stress relief sub-layer, and the encapsulation layer includes the first inorganic layer, the organic layer and the second inorganic layer.

In some embodiments, the method further includes: forming a first inorganic layer on the conductive terminals; forming an organic layer on the first inorganic layer; and forming a second inorganic layer on the organic layer. The encapsulation layer includes the first inorganic layer, the organic layer and the second inorganic layer. Forming the stress relief layer includes: forming a third inorganic layer in the bonding region, and patterning the third inorganic layer to form a first stress relief sub-layer; and forming a fourth inorganic layer in the bonding region, and patterning the fourth inorganic layer to form a second stress relief sub-layer. The stress relief layer includes the first stress relief sub-layer and/or the second stress relief sub-layer.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to those drawings without paying any creative effort.

Figure 9:
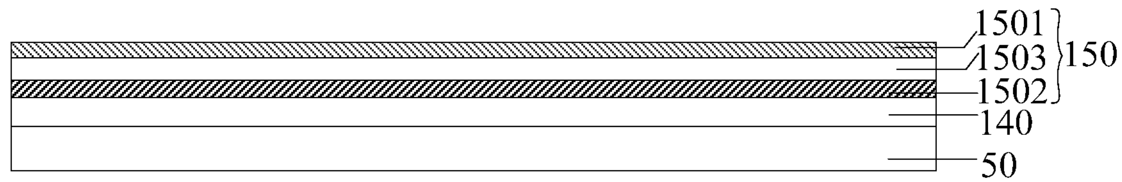
Figure 11:
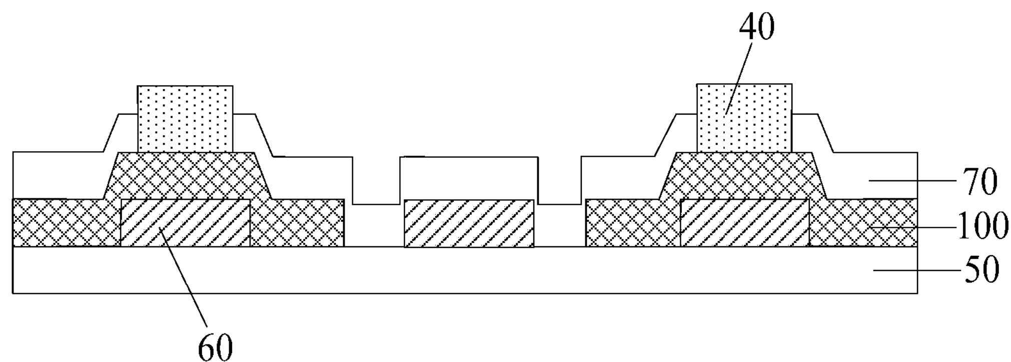
Figure 12:
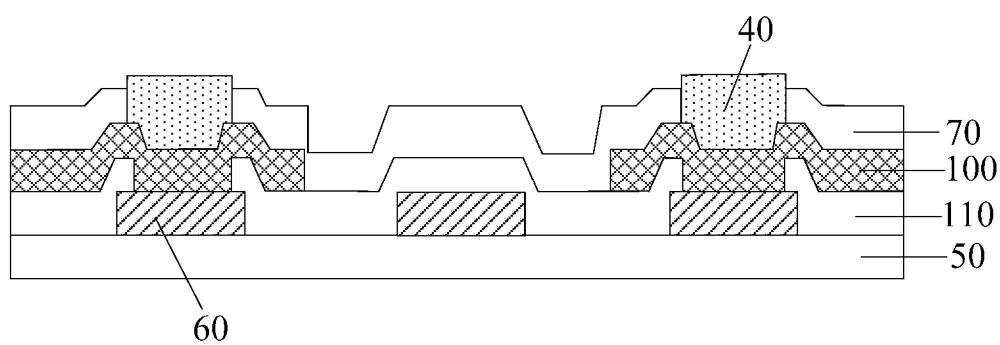
Figure 13:
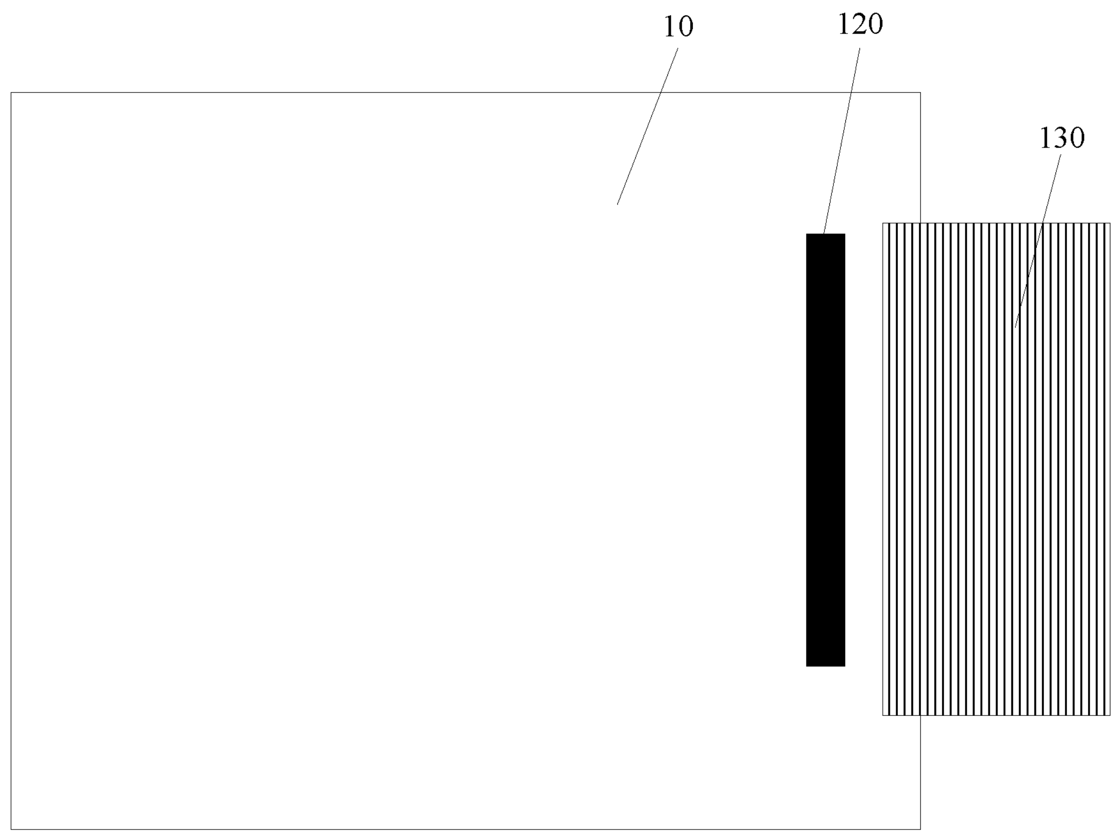
Figure 14:
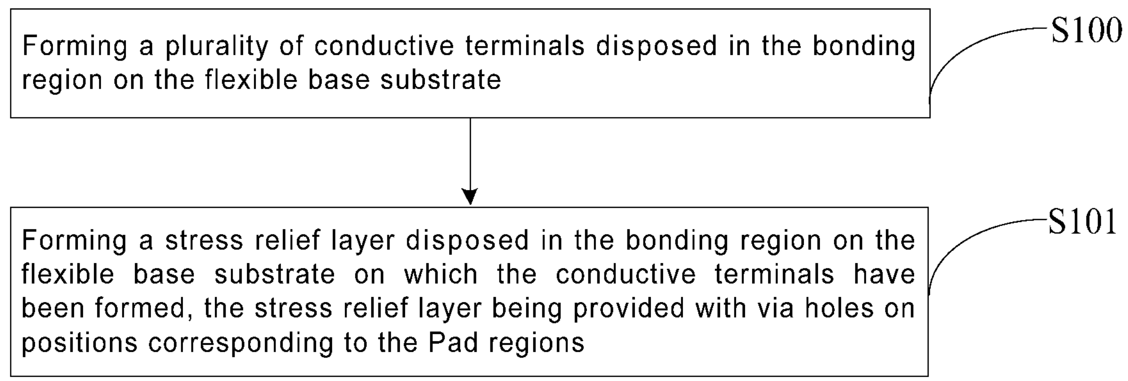
Figure 15:
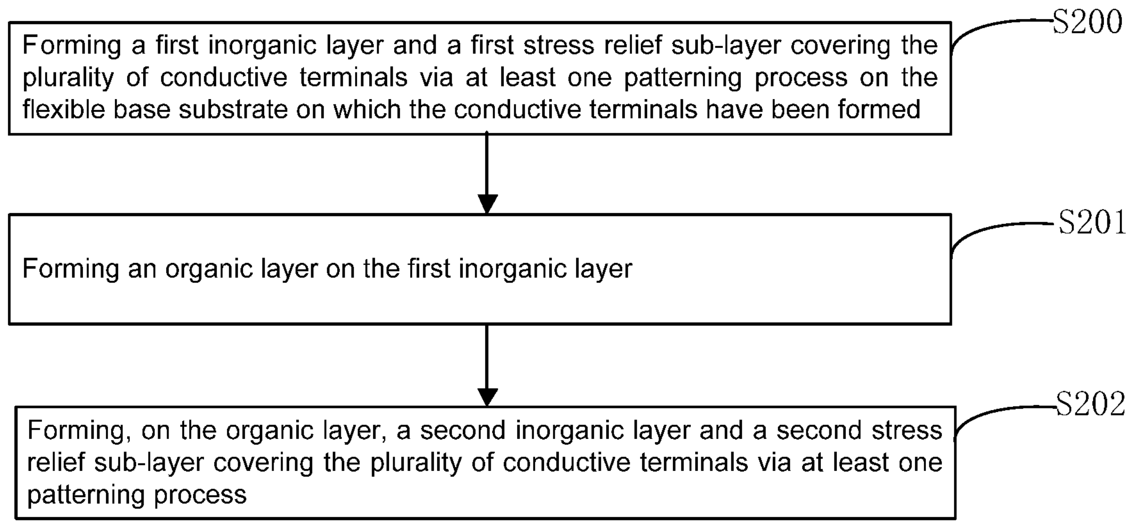
Figure 16:
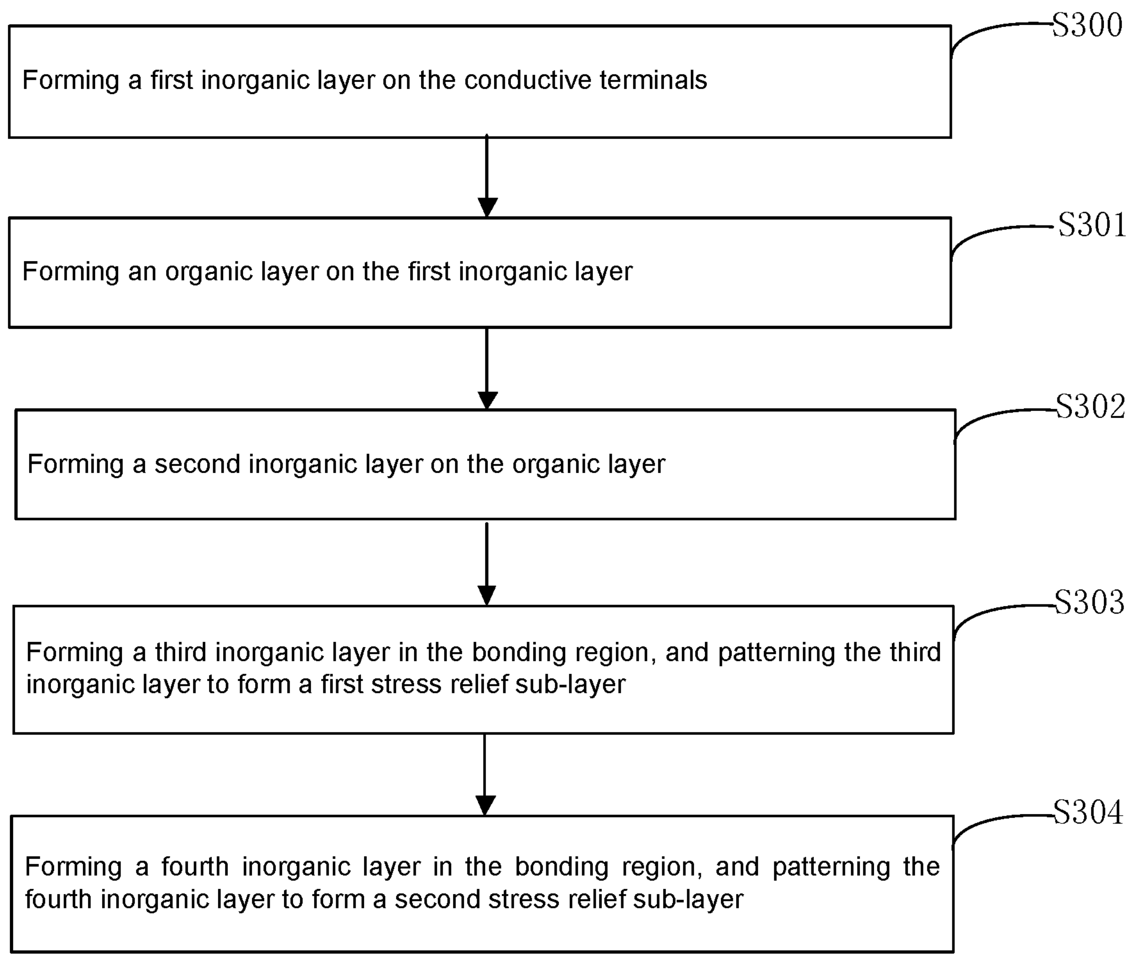

FIG. **8*a*** is a second schematic diagram showing a structure of a bonding region of a flexible display substrate according to some embodiments of the present disclosure;

FIG. **8*b*** is a third schematic diagram showing a structure of a bonding region of a flexible display substrate according to some embodiments of the present disclosure;

FIG. **8*c*** is a fourth schematic diagram showing a structure of a bonding region of a flexible display substrate according to some embodiments of the present disclosure;

FIG. 9 is a schematic diagram showing a structure of a flexible display substrate including a touch layer and a planarization layer according to some embodiments of the present disclosure;

FIG. **10*a*** is a fifth schematic diagram showing a structure of a bonding region of a flexible display substrate according to some embodiments of the present disclosure;

FIG. **10*b*** is a sixth schematic diagram showing a structure of a bonding region of a flexible display substrate according to some embodiments of the present disclosure;

FIG. 11 is a seventh schematic diagram showing a structure of a bonding region of a flexible display substrate according to some embodiments of the present disclosure;

FIG. 12 is an eighth schematic diagram showing a structure of a bonding region of a flexible display substrate according to some embodiments of the present disclosure;

FIG. 13 is a schematic diagram showing a structure of a flexible display device according to some embodiments of the present disclosure;

FIG. 14 is a first flow diagram of a method for manufacturing a flexible display substrate according to some embodiments of the present disclosure;

FIG. 15 is a second flow diagram of a method for manufacturing a flexible display substrate according to some embodiments of the present disclosure; and FIG. 16 is a third flow diagram of a method for manufacturing a flexible display substrate according to some embodiments of the present disclosure.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In some embodiments, an integrated circuit (IC) in a flexible display device is bonded in a way of Chip On Film (COF), that is, the IC is first bonded on a flexible circuit board, and then the flexible circuit board bonded with the IC is pressed onto a display panel.

Since the flexible circuit board is made of a soft material, the flexible circuit board bonded with the IC will not cause breakage of lines of an array substrate of the display panel when pressed on the display panel. However, since costs of COF are very high and lines of COF cannot be made too thin, COF cannot be used on high-resolution products.

Figure 1:
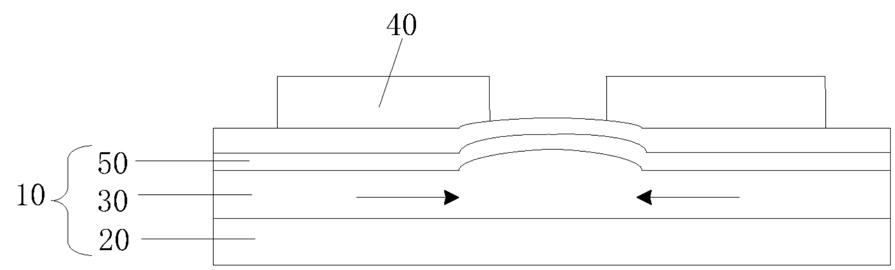
FIG. 1 is a schematic diagram showing a flexible display substrate and a protective substrate bonded via an adhesive according to some embodiments of the present disclosure.

In some other embodiments, a bonding method of COP (Chip on plastic, directly bonding an IC on a flexible display substrate) is used. However, due to a high hardness, when directly bonded, the IC may be sunk on the flexible display substrate, leading to breakage of metal wirings of the flexible display substrate. For example, as shown in FIG. 1, since the flexible display substrate 10 is generally soft, a flexible base substrate 50 in the flexible display substrate 10 may be bonded to a protective substrate 20 having a relatively hard property via an adhesive 30.

It is noted that in some embodiments, the flexible display substrate 10 is a display substrate or a display panel.

Furthermore, the flexible display substrate 10 may or may not include the protective substrate 20. In the case where the flexible display substrate 10 includes the protective substrate 20, hardness of the protective substrate 20 is higher than that of the flexible base substrate 50; thereby the protective substrate 20 may protect the flexible base substrate 50 and display devices thereon. Both the protective substrate 20 and the flexible base substrate 50 are flexible substrates. The present disclosure does not limit the material of the protective substrate 20, which is, for example, polyethylene terephthalate (PET). The present disclosure does not limit the material of the flexible base substrate 50, which is, for example, polyimide (PI).

Based on this, in the case where the flexible display substrate 10 includes the protective substrate 20, and in the process of manufacturing the flexible display substrate 10, the flexible base substrate 50 may be first formed on a rigid substrate (e.g., glass), and then display devices are formed on the flexible base substrate 50. After the display devices are completed, the flexible base substrate 50 is separated from the rigid substrate. Thereafter, the flexible base substrate 50 with the display devices and the protective substrate 20 are bonded together via the adhesive 30 to obtain the flexible display substrate 10 with the protective substrate 20.

However, as shown in FIG. 1, in the case where the flexible display substrate 10 includes the protective substrate 20, when the IC is connected to the flexible display substrate 10 under pressure to electrically connect the IC bumps 40 of the IC to conductive terminals (not shown in FIG. 1) of the flexible display substrate 10, the adhesive 30 under the flexible base substrate 50 will flow when squeezed, so that the adhesive 30 will be filled into a region between two adjacent IC bumps 40 of the IC, making the flexible display substrate 10 tilted. Thus, the metal wirings of the flexible display substrate 10 will break at the above tilted position.

Figure 2:
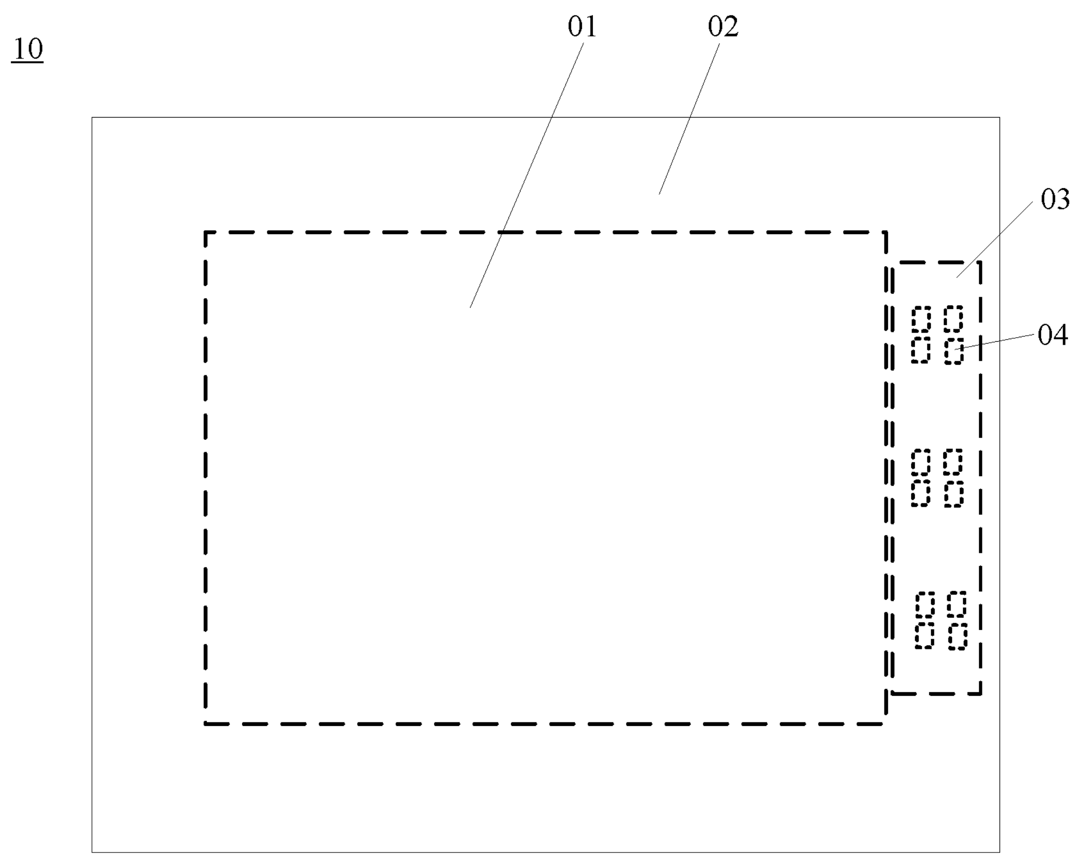
FIG. 2 is a schematic diagram showing region division of a flexible display substrate according to some embodiments of the present disclosure.

With regard to the above problem, some embodiments of the present disclosure provides a flexible display substrate 10, and as shown in FIG. 2, the flexible display substrate 10 is divided into a display region 01 and a non-display region 02 located around the display region 01. The non-display region 02 includes a bonding region 03, which includes Pad regions 04.

It is noted that, in some embodiments, the bonding region 03 refers to a region in the non-display region 02 for bonding the IC. In addition, the Pad region 04 refers to a region in the bonding region 03 for electrically connecting the IC to the wirings in the flexible display substrate 10.

The flexible display substrate 10 includes a plurality of conductive terminals 60 (shown in FIG. 3) disposed on the flexible base substrate 50, and the conductive terminals 60 are disposed in the bonding region 03. When the IC is connected to the flexible display substrate 10 under pressure, the IC bumps 40 of the IC contact conductive surfaces of the conductive terminals of the flexible display substrate 10 respectively. Thus, the IC is electrically connected to the conductive terminals 60 to achieve bonding of the IC, thereby inputting signals on the IC to the conductive terminals or outputting signals on the conductive terminals to the IC.

Figure 3:
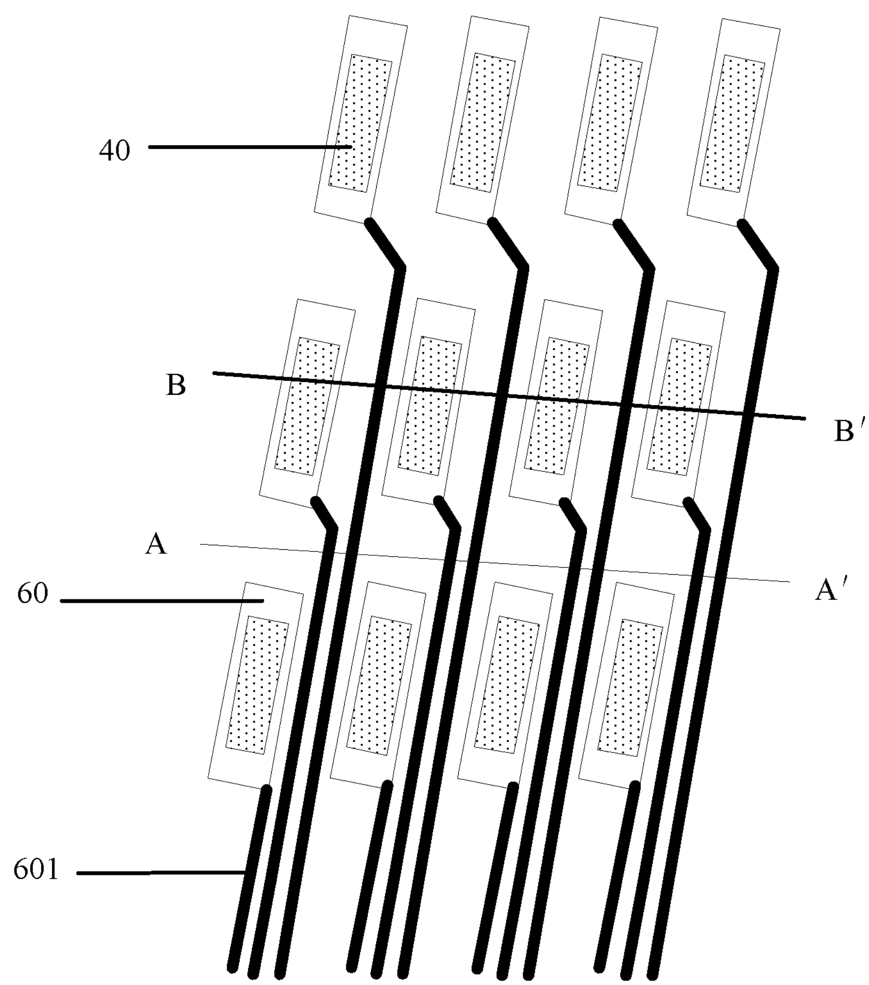
FIG. 3 is a first schematic diagram showing a structure of a bonding region of a flexible display substrate according to some embodiments of the present disclosure.

For example, as shown in FIG. 3, the flexible display substrate 01 further includes metal lead wires 601 located in the non-display region 02. Each conductive terminal 60 is connected to a metal lead wire 601 of the flexible display substrate 10, and the metal lead wire 601 is connected to a metal wiring in the display region 01 of the flexible display substrate 10, so that a signal on the metal wiring may be input to the conductive terminal 60, or a signal on the conductive terminal 60 may also be input to the metal wiring.

Figure 4:
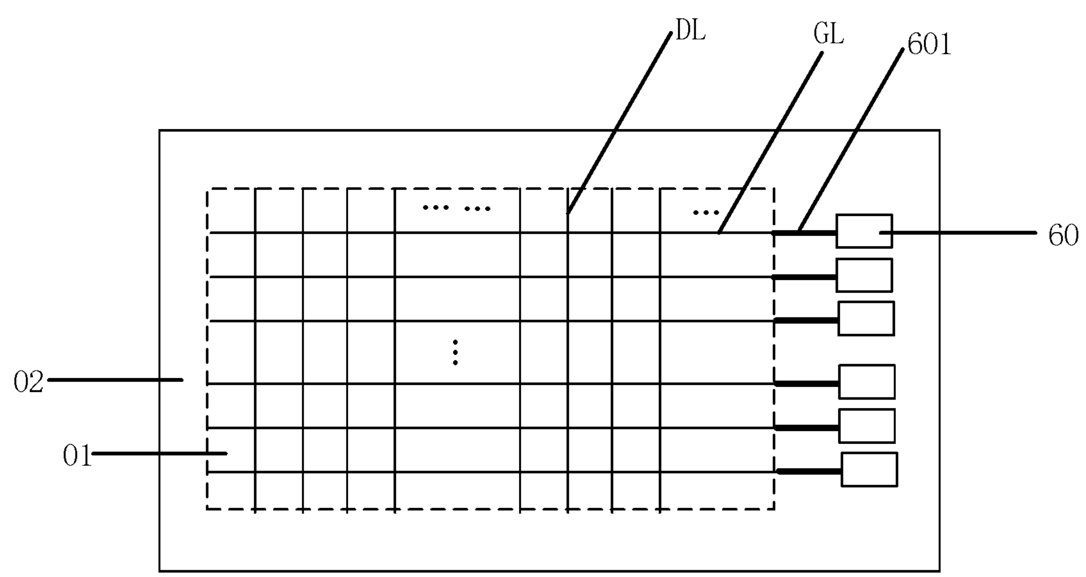
FIG. 4 is a schematic diagram of metal wirings in a display region according to some embodiments of the present disclosure.

In some embodiments, as shown in FIG. 4, the flexible display substrate 10 includes, in the display region 01, crossed gate lines GL and data lines DL. In this case, when the metal wirings are the gate lines GL, the conductive terminals 60 and the metal lead wires 601 are in a same layer and of a same material as the gate lines GL. Alternatively, when the metal wirings are the data lines DL, the conductive terminals 60 and the metal lead wires 601 are in a same layer and of a same material as the data lines DL.

Figure 5:
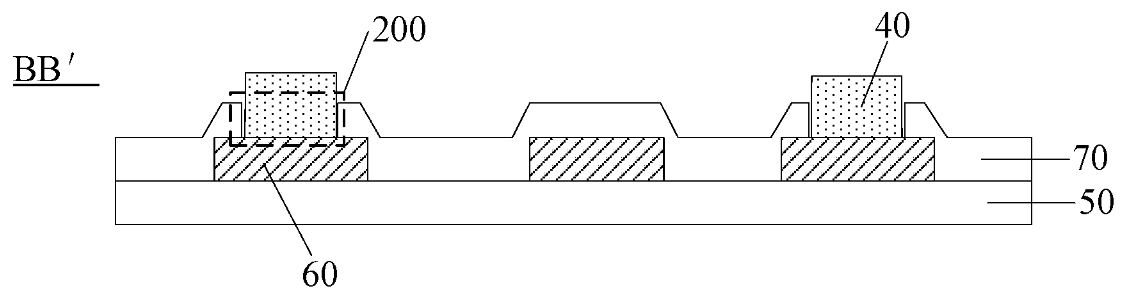
FIG. 5 is a sectional view sectioned along BB' of FIG. 3.
Figure 6:
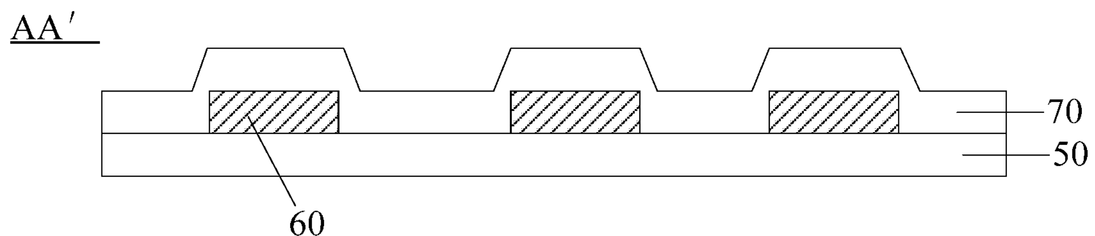
FIG. 6 is a sectional view sectioned along AA' of FIG. 3.

Besides, as shown in FIG. 5 or FIG. 6, the flexible display substrate 10 further includes a stress relief layer 70 located in the bonding region 03 and disposed on a side of the plurality of the conductive terminals 60 away from the flexible base substrate 50.

The stress relief layer 70, as shown in FIG. 5, is provided with via holes 200 on positions corresponding to Pad regions 04, and each via hole 200 is used for exposing a conductive surface of a corresponding conductive terminal 60. The conductive surface of the conductive terminal 60 is used to bond the IC.

In this case, when the IC bump 40 of the IC is connected to the conductive surface of the flexible display substrate 10 under pressure, the IC bump 40 contacts the conductive surface of the conductive terminal 60 through the via hole 200 of the stress relief layer 70. Therefore, the signal on the metal wiring in the display region 01 is transmitted to the conductive terminal 60 through the metal lead wire 601, and then is transmitted to the IC from the conductive terminal 60. Alternatively, the signal on the IC is transmitted to the metal wiring in the display region 01 sequentially through the conductive terminal 60 and the metal lead wire 601.

The present disclosure does not limit the material of the stress relief layer 70, which includes, for example, an organic material or an inorganic material. Since effects of the stress relief layer 70 are to release the stress and suppress deformation of the flexible display substrate 10, materials with high hardness and large elastic modulus that are not susceptible to deformation may be selected for manufacturing the stress relief layer 70. On this basis, compared with organic materials, inorganic materials have larger elastic modulus and higher hardness and are less susceptible to deformation. Therefore, in some embodiments, the material for forming the stress relief layer 70 includes an inorganic material. The present disclosure does not limit the inorganic material. Since silicon nitride (SiNx), silicon oxide (SiOx) and silicon oxynitride (SiOxOy) have high hardness and large elastic modulus, and the intrinsic stress (internal stress) thereof is a compressive stress, in some embodiments, the material of the stress relief layer 70 includes at least one of silicon nitride, silicon oxide or silicon oxynitride.

On this basis, the stress relief layer 70 may be fabricated simultaneously with the film layer of the flexible display substrate 10, or may be separately fabricated in the bonding region 03, which is not limited in the present disclosure.

In summary, the flexible display substrate 10 provided by the embodiments of the present disclosure includes a plurality of conductive terminals 60 and a stress relief layer 70 disposed on the conductive terminals 60. The stress relief layer 70 has via holes 100 on positions corresponding to the Pad regions 04 and each via hole 100 is for exposing a conductive surface of a corresponding conductive terminal 60. Therefore, when the IC is connected to the flexible display substrate 10 under pressure to electrically connect the IC bumps 40 of the IC to the conductive terminals 60 after the flexible base substrate 50 and the protective substrate 20 are bonded together via an adhesive 30, although the adhesive 30 under the IC bumps 40 will flow to the region between two adjacent IC bumps 40, since the flexible display substrate 10 is provided with the stress relief layer 70, which may absorb the stress generated by the adhesive 30 toward the stress relief layer 70, the effect of releasing the stress may be achieved, and the deformation degree when the bonding region 03 of the flexible display substrate 10 is tilted may be reduced. This, thereby, reduces the probability of occurrence of problems such as breakage of the metal wirings, bad contact of the metal wirings, and a short circuit arising from aggregation of conductive particles in the display region 01 caused by deformation of the flexible display substrate 10.

On this basis, since the stress relief layer 70 covers the bonding region 03, when the material for forming the stress relief layer 70 includes an inorganic material, the stress relief layer 70 has a good effect of blocking water oxygen and particles, thereby preventing moisture, oxygen and the like from corroding the bonding region 03 and preventing the metal particles from entering the bonding region 03, and thus enhancing bonding reliability of the bonding region 03.

In some embodiments, a thickness of the stress relief layer 70 ranges from 0.1 μm to 1.0 μm. If the thickness of the stress relief layer 70 is less than 0.1 μm, the stress relief layer 70 may be easily deformed due to a too small thickness, thus failing to relieve the stress effectively. If the thickness of the stress relief layer 70 is larger than 1.0 μm, the too large thickness may lead to an increase in a thickness of the flexible display substrate 10, which is not conductive to lightening and thinning the flexible display substrate 10. Furthermore, if the thickness is too large, the IC bumps 40 of the IC may not be effectively connected to the conductive terminals when the IC is connected to the flexible display substrate 10 under pressure. The thickness of the stress relief layer 70 is, for example, 0.3 μm, 0.5 μm or 0.6 μm.

Setting of the above stress relief layer 70 is exemplified below.

Figure 7:
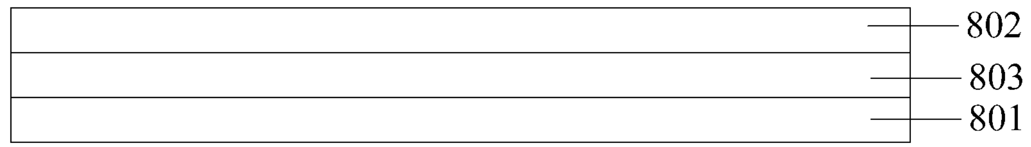
FIG. 7 is a schematic diagram showing a structure of an encapsulation layer according to some embodiments of the present disclosure.

In some embodiments, the flexible display substrate 10 is a flexible display substrate in an LCD. In some other embodiments, the flexible display substrate 10 is a flexible display substrate in an OLED. In the case where the flexible display substrate 10 is the display substrate in the OLED, in a process of fabricating the flexible display substrate 10, after display devices are formed on the flexible base substrate 50 through evaporation, the display devices are encapsulated by an encapsulation layer 80 (as shown in FIG. 7).

In a case where the flexible display substrate 10 further includes the encapsulation layer 80 which includes at least one thin film layer, in some embodiments, the stress relief layer 70 and at least one thin film layer in the encapsulation layer 80 are in a same layer and of a same material.

It is noted that the encapsulation layer 80 include, for example, only one thin film layer, or two or more thin film layers. In some embodiments, the encapsulation layer 80 includes a plurality of thin film layers, and the stress relief layer 70 and any of the thin film layers in the encapsulation layer 80 are in a same layer and of a same material. Alternatively, the stress relief layer 70 includes a plurality of thin film layers, and the plurality of thin film layers in the stress relief layer 70 are respectively in a same layer and of a same material as the plurality of thin film layers in the encapsulation layer.

In this way, since the stress relief layer 70 and at least one thin film layer in the encapsulation layer 80 are in a same layer and of a same material, the fabrication processes of the stress relief layer 70 and the at least one thin film layer in the encapsulation layer 80 may be partially or entirely the same, thereby simplifying the fabrication process of the flexible display substrate 10.

For example, as shown in FIG. 7, the encapsulation layer 80 includes a first inorganic layer 801, a second inorganic layer 802 and an organic layer 803 disposed between the first inorganic layer 801 and the second inorganic layer 802.

Figure 8A:
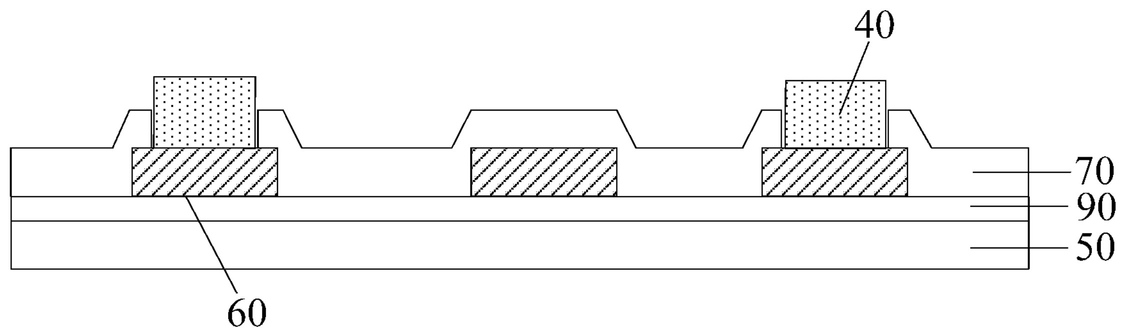

In this case, in some embodiments, as shown in FIG. 8*a*, the stress relief layer 70 is a single-layer structure, and the stress relief layer 70 and the first inorganic layer 801 or the second inorganic layer 802 are in a same layer and of a same material.

Figure 8B:
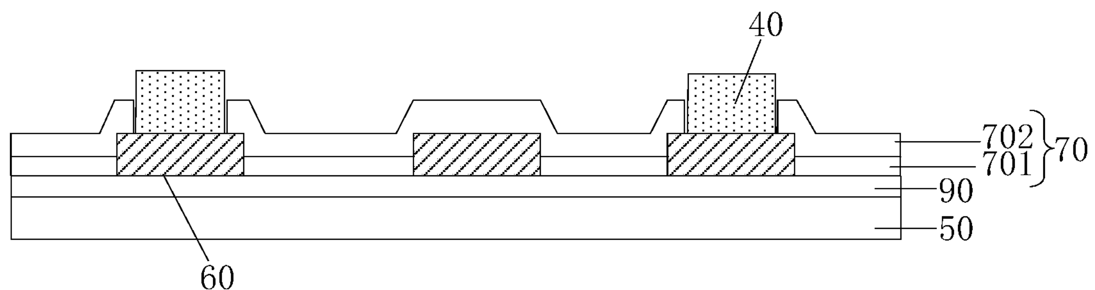

In some other embodiments, as shown in FIG. 8*b*, the stress relief layer 70 is of a multilayer structure, and the stress relief layer 70 includes a first stress relief sub-layer 701 and a second stress relief sub-layer 702 stacked on one another. The first stress relief sub-layer 701 and the first inorganic layer 801 are in a same layer and of a same material, and the second stress relief sub-layer 702 and the second inorganic layer 802 are in a same layer and of a same material.

Materials of the first inorganic layer 801 and the second inorganic layer 802 are not limited in the present disclosure, as long as they are of an inorganic material. For example, materials of the first inorganic layer 801 and the second inorganic layer 802 include at least one of silicon nitride, silicon oxide or silicon oxynitride. Furthermore, a material of the first inorganic layer 801 may be the same as or different from a material of the second inorganic layer 802.

In this way, when the stress relief layer 70 and the first inorganic layer 801 in the encapsulation layer 80 are in a same layer and of a same material, fabrication processes of the stress relief layer 70 and the first inorganic layer 801 may be partially or entirely the same. When the stress relief layer 70 and the second inorganic layer 802 in the encapsulation layer 80 are in a same layer and of a same material, fabrication processes of the stress relief layer 70 and the second inorganic layer 802 may be partially or entirely the same. When the first stress relief sub-layer and the first inorganic layer 801 are in a same layer and of a same material, and the second stress relief sub-layer and the second inorganic layer 802 are in a same layer and of a same material, fabrication processes of the first stress relief sub-layer and the first inorganic layer 801 may be partially or entirely the same, and fabrication processes of the second stress relief sub-layer and the second inorganic layer 802 may be partially or entirely the same, which simplifies the fabrication process of the flexible display substrate 10. In addition, since the material of the stress relief layer 70 is an inorganic material, the stress relief layer 70 may effectively absorb the stress generated when the IC is pressed during the IC bonding process, thereby effectively suppressing deformation of the flexible display substrate 10.

Figure 8C:
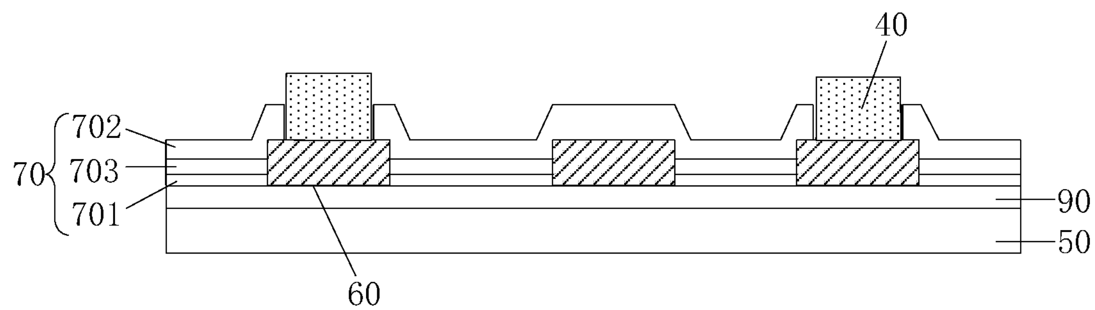

In some embodiments, the stress relief layer 70, as shown in FIG. 8*c*, further includes a third stress relief sub-layer 703 disposed between the first stress relief sub-layer 701 and the second stress relief sub-layer 702, and the third stress relief sub-layer 703 is in a same layer and of a same material as the organic layer 803 in the encapsulation layer 80, so that fabrication processes of the third stress relief sub-layer 703 and the organic layer 803 may be partially or entirely the same. In this case, the stress relief layer 70 includes the first stress relief sub-layer 701, the second stress relief sub-layer 702, and the third stress relief sub-layer 703.

On this basis, the flexible display substrate 10 further includes other film layers disposed between the flexible base substrate 50 and the conductive terminals 60. For example, the other film layers described above may be a barrier layer and/or a buffer layer 90 as shown in FIGS. 8*a*, 8*b* and 8*c*.

Materials of the buffer layer 90 and the barrier layer include, for example, at least one of silicon dioxide ($SiO_2$), titanium dioxide ($TiO_2$), or cerium dioxide ($CeO_2$).

In this way, when the flexible display substrate 10 is deformed, the buffer layer 90 may reduce deformation of film layers above the buffer layer 90. In addition, the barrier layer is disposed between the flexible base substrate 50 and the conductive terminals 60, and may prevent oxygen or moisture from entering and eroding the flexible display substrate 10.

In some embodiments, the flexible display substrate 10 is a flexible touch display substrate, and as shown in FIG. 9, the flexible display substrate 10 further includes a planarization layer 140 and a touch layer 150 disposed on the planarization layer 140.

The touch layer 150 includes a first touch electrode layer 1501, a second touch electrode layer 1502, and an insulation layer 1503 disposed between the first touch electrode layer 1501 and the second touch electrode layer 1502.

In this case, when the stress relief layer 70 is of a single-layer structure, as shown in FIG. 8*a*, the stress relief layer 70 and the planarization layer 140 or the insulation layer 1503 are in a same layer and of a same material.

Alternatively, as shown in FIG. 8*b*, the stress relief layer 70 is of a multilayer structure, and the stress relief layer 70 includes a first stress relief sub-layer 701 and a second stress relief sub-layer 702 stacked on one another. The first stress relief sub-layer 701 and the planarization layer 140 are in a same layer and of a same material, and the second stress relief sub-layer 702 and the insulation layer 1503 are in a same layer and of a same material.

It is noted that a plurality of film layers for constituting display devices are disposed between the planarization layer 140 and the flexible base substrate 50, which will not be elaborated here in the present disclosure.

The present disclosure does not limit materials of the planarization layer 140 and the insulation layer 1503, and the material of the planarization layer 140 or the insulation layer 1503 may include at least one of silicon nitride, silicon oxide or silicon oxynitride.

Specific structures of the first touch electrode layer 1501 and the second touch electrode layer 1502 will not be elaborated here.

In this case, when the stress relief layer 70 and the planarization layer 140 are in a same layer and of a same material, fabrication processes of the stress relief layer 70 and the planarization layer 140 may be partially or entirely the same. When the stress relief layer 70 and the insulation layer 1503 are in a same layer and of a same material, fabrication processes of the stress relief layer 70 and the insulation layer 1503 may be partially or entirely the same. When the stress relief layer 70 includes the first stress relief sub-layer 701 and the second stress relief sub-layer 702, and the first stress relief sub-layer 701 and the planarization layer 140 are in a same layer and of a same material, and the second stress relief sub-layer 702 and the insulation layer 1503 are in a same layer and of a same material, fabrication processes of the first stress relief sub-layer 701 and the planarization layer 140 may be partially or entirely the same, and fabrication processes of the second stress relief sub-layer 702 and the insulation layer 1503 may be partially or entirely the same.

Figure 10A:
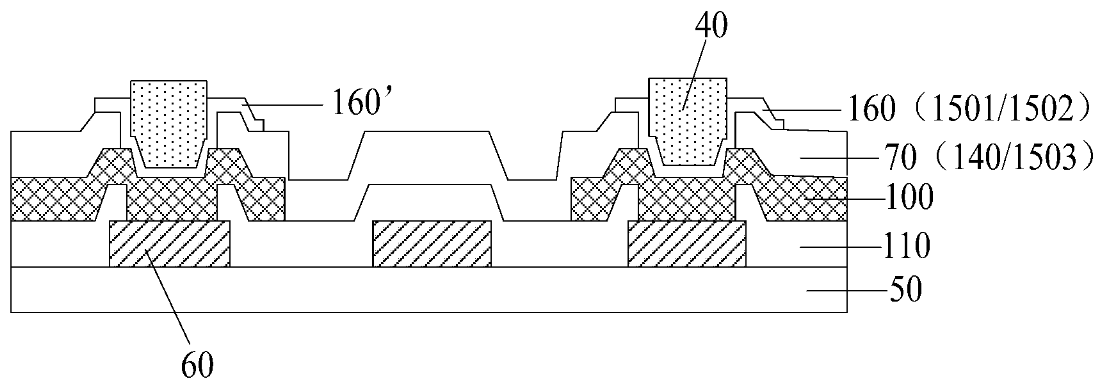

Furthermore, in some embodiments, as shown in FIG. 10*a*, the flexible display substrate 10 further includes a first connection pattern 160 disposed on a side of the conductive terminals 60 away from the flexible base substrate 50. The first connection pattern 160 includes a plurality of first connection portions 160' each of which is electrically connected to a corresponding conductive terminal 60.

The first connection pattern 160 and the first touch electrode layer 1501 or the second touch electrode layer 1502 are in a same layer and of a same material.

Figure 10B:
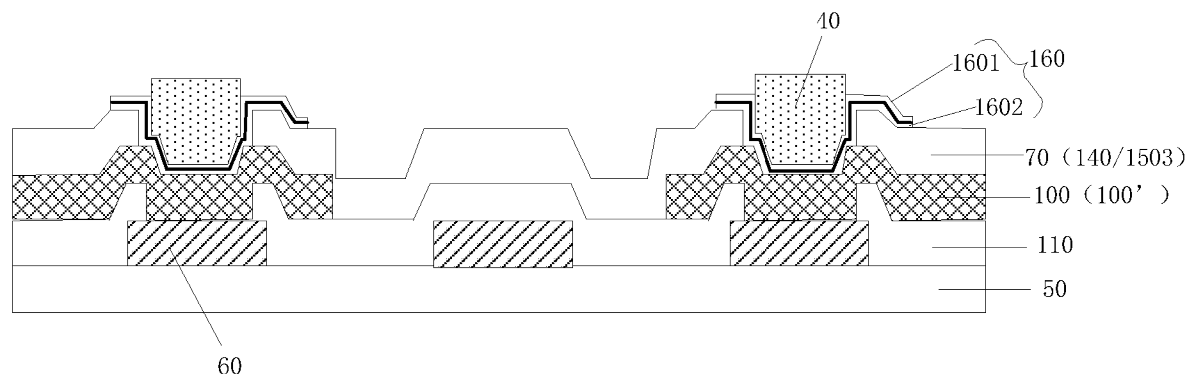

Alternatively, as shown in FIG. 10*b*, the first connection pattern 160 includes a first connection sub-pattern 1601 and a second connection sub-pattern 1602 stacked on one another. The first connection sub-pattern 1601 and the first touch electrode layer 1501 are in a same layer and of a same material, and the second connection sub-pattern 1602 and the second touch electrode layer 1502 are in a same layer and of a same material.

It is noted that the first connection portion 160' is electrically connected to the conductive terminal 60, in which the connection may be a direct connection, that is, the first connection portion 160' contacts the conductive terminal 60. Alternatively, the first connection portion 160' and the conductive terminal 60 are indirectly connected through other film layers in order to achieve the objective of electrical connection.

Here, the first connection portion 160' is disposed on the conductive terminal 60, so that when the IC is connected to the flexible display substrate 10 under pressure, it is advantageous to output the signals on the conductive terminal 60 to the IC bump 40 of the IC.

In this way, when the first connection pattern 160 and the first touch electrode layer 1501 are in a same layer and of a same material, fabrication processes of the first connection pattern 160 and the first touch electrode layer 1501 may be partially or entirely the same. When the first connection pattern 160 and the second touch electrode layer 1502 are in a same layer and of a same material, fabrication processes of the first connection pattern 160 and the second touch electrode layer 1502 may be partially or entirely the same. When the first connection pattern 160 includes the first connection sub-pattern 1601 and the second connection sub-pattern 1602, the first connection sub-pattern 1601 and the first touch electrode layer 1501 are in a same layer and of a same material, and fabrication processes of the first connection sub-pattern 1601 and the first touch electrode layer 1501 may be partially or entirely the same. In addition, the second connection sub-pattern 1602 and the second touch electrode layer 1502 are in a same layer and of a same material, and fabrication processes of the second connection sub-pattern 1602 and the second touch electrode layer 1502 may be partially or entirely the same.

In some embodiments, as shown in FIGS. 10*a*, 10*b* and 11, the flexible display substrate 10 further includes a second connection pattern 100 disposed between the conductive terminals 60 and the stress relief layer 70. The second connection pattern 100 includes a plurality of second connection portions 100' each of which is electrically connected to a corresponding conductive terminal 60.

It is noted that the second connection portion 100' is electrically connected to the conductive terminal 60, in which the connection may be that, as shown in FIG. 11, the second connection portion 100' is directly connected to the conductive terminal 60, that is, the second connection portion 100' contacts the conductive terminal 60. Alternatively, as shown in FIG. 10*a* or 10*b*, the second connection portion 100' and the conductive terminal 60 are indirectly connected through other film layers, in order to achieve the objective of electrical connection.

The second connection pattern 100 may be formed simultaneously with the metal wirings in the display region 01.

Here, the material of the second connection pattern 100 is not limited, and is, for example, a metal element such as silver (Ag), copper (Cu), or aluminum (Al) or a metal oxide.

In some embodiments, the conductive terminals 60 and the gate lines GL are in a same layer and of a same material, and the second connection pattern 100 and the data lines DL are in a same layer and of a same material, so that the conductive terminals 60 may be simultaneously fabricated with the gate lines GL, and the second connection pattern 100 may be simultaneously fabricated with the data lines DL. Alternatively, the conductive terminals 60 and the data lines DL are in a same layer and of a same material, and the second connection pattern 100 and the gate lines GL are in a same layer and of a same material, so that the conductive terminals 60 may be simultaneously fabricated with the data lines DL, and the second connection pattern 100 may be simultaneously fabricated with the gate lines GL, thereby simplifying the fabrication process of the flexible display substrate 10.

In this way, the second connection pattern 100 is disposed between the conductive terminals 60 and the stress relief layer 70, and the second connection portion 100' is electrically connected to the conductive terminal 60. Signals on the conductive terminal 60 thus may be output to the second connection portion 100', preventing the circumstance that the signals on the conductive terminal 60 are not transmitted to the IC bump 40 due to poor contact between the conductive terminal 60 and the IC bump 40 of the IC when the IC is connected to the flexible display substrate 10 under pressure.

It is noted that in some embodiments, the flexible display substrate 10 includes only one of the first connection pattern 160 and the second connection pattern 100. Alternatively, the flexible display substrate 10 includes both the first connection pattern 160 and the second connection pattern 100 as shown in FIG. 9.

In some embodiments, as shown in FIG. 12, the flexible display substrate 10 further includes an intermediate dielectric layer 110 disposed between the conductive terminals 60 and the second connection pattern 100. A portion of the intermediate dielectric layer 110 located in each Pad region 04 has a via hole for exposing a conductive surface of a corresponding conductive terminal 60.

The present disclosure does not limit the material of the intermediate dielectric layer 110, which includes, for example, at least one of silicon nitride, silicon oxide or silicon oxynitride.

In some embodiments, the intermediate dielectric layer 110 and the insulation layer disposed between the gate lines GL and the data lines DL in the display region 01 are in a same layer and of a same material, so that the insulation layer and the intermediate dielectric layer 110 may be simultaneously formed, thereby simplifying the fabrication process of the flexible display substrate 10.

Some embodiments of the present disclosure provide a flexible display device, including an IC and any one of the flexible display substrates 10 described above. The IC has IC bumps 40 each of which contacts a conductive surface of a corresponding conductive terminal 60 of the flexible display substrate 10.

Here, the IC bump 40 contacts the conductive terminal 60 of the flexible display substrate 10 under pressure, and the conductive terminal 60 is connected to the metal wiring (e.g., the gate line GL or the data line DL) in the display region 01 through the above metal lead wire 601, so that signals on the IC may be input to the metal wiring, or signals on the metal wiring may be input to the IC.

The IC bump 40 is connected to the conductive terminal 60 through the via hole 200 of the stress relief layer 70 in the flexible display substrate 10. In order to ensure that the IC bump 40 is electrically connected to the conductive terminal 60, an orthographic projection of the IC bump 40 on the flexible base substrate 50 is within a range of an orthographic projection of the border of the via hole 200 of the stress relief layer 70 on the flexible base substrate 50.

Alternatively, an orthographic projection of the border of the IC bump 40 on the flexible base substrate 50 entirely or nearly entirely overlaps an orthographic projection of the border of the via hole 200 of the stress relief layer 70 on the flexible base substrate 50.

It is noted that, as shown in FIG. 13, after the IC 120 is connected to the flexible display substrate 10 in the flexible display device, a flexible printed circuit 130 (FPC) in the flexible display device is in signal communication with the IC 120.

The flexible display device described above has the same technical effects as the flexible display substrate 10 provided in the foregoing examples, which will not be elaborated here.

Some embodiments of the present disclosure provide a method for manufacturing the flexible display substrate 10. The flexible display substrate 10 has a bonding region 03, and the bonding region 03 includes Pad regions 04. As shown in FIG. 14, the above method includes S100 and S101.

In S100, a plurality of conductive terminals 60 are formed on the flexible base substrate 50, and the conductive terminals are disposed in the bonding region 03.

The present disclosure does not limit the material of the flexible base substrate 50, which is, for example, PI.

In S101, a stress relief layer 70 is formed on the flexible base substrate 50 on which the above conductive terminals 60 have been formed, and the stress relief layer 70 is disposed in the bonding region 03 and is provided with via holes 200 on positions respectively corresponding to the pad regions 04.

Each via hole 200 is used to expose a conductive surface of a corresponding conductive terminal 60, and the conductive surface is used for bonding the IC.

It is noted that the present disclosure does not limit the material of the stress relief layer 70, which is, for example, an organic material or an inorganic material. Since effects of the stress relief layer 70 are to release stress and suppress deformation of the flexible display substrate, materials for manufacturing the stress relief layer 70 have a higher hardness and are less susceptible to deformation.

The method for manufacturing the flexible display substrate 10 described above has the same technical effects as the flexible display substrate 10 provided in the foregoing examples, which will not be elaborated here.

In some embodiments, the above S101, as shown in FIG. 15, includes S200-S202.

In S200, a first inorganic layer 801 and a first stress relief sub-layer 701 covering the plurality of conductive terminals 60 are formed via at least one patterning process on the flexible base substrate 50 on which the conductive terminals 60 have been formed.

In some examples, the at least one patterning process includes a single patterning process. In some other examples, the at least one patterning process includes two patterning processes. In some embodiments, the patterning process may include a photolithographic process, or may include a photolithographic process and an etching step, or may also include other processes for forming a predetermined pattern, such as printing and inkjet. The photolithographic process refers to a process of forming a pattern by using a photoresist, a mask, an exposure machine and the like in a procedure including film formation, exposure, development and the like. A corresponding patterning process may be selected in accordance with the structures formed in some embodiments of the present disclosure.

In some embodiments, the single patterning process refers to a process of forming an expected pattern by performing a single exposure process via a mask to form different exposure regions and then performing removal processes such as multiple etching and ashing on the different exposure regions.

In S201, an organic layer 803 is formed on the inorganic layer 801.

Here, the organic layer 803 may be formed by ink-jet printing (IJP).

In S202, a second inorganic layer 802 and a second stress relief sub-layer 702 covering the plurality of conductive terminals 60 are formed via at least one patterning process on the organic layer 803.

The stress relief layer 70 includes a first stress relief sub-layer 701 and/or a second stress relief sub-layer 702, and the encapsulation layer 80 includes a first inorganic layer 801, an organic layer 803 and a second inorganic layer 802.

It is noted that the stress relief layer 70 may include only the first stress relief sub-layer 701. Since the stress relief layer 70 has via holes 200 on positions corresponding to the Pad regions 04, the first stress relief sub-layer 701 has the via holes 200 described above on positions corresponding to the Pad regions 04.

Alternatively, the stress relief layer 70 may include only the second stress relief sub-layer 702. Since the stress relief layer 70 has via holes 200 on positions corresponding to the Pad regions 04, the second stress relief sub-layer has the via holes 200 on positions corresponding to the Pad regions 04.

Alternatively, the stress relief layer 70 may include a first stress relief sub-layer 701 and a second stress relief sub-layer 702. Since the stress relief layer 70 has via holes 200 on positions corresponding to the Pad regions 04, both the first stress relief sub-layer 701 and the second stress relief sub-layer 702 have via holes 200 on positions corresponding to the Pad regions 04.

The method of forming the first inorganic layer 801 and the first stress relief sub-layer 701 via a single patterning process includes: blocking the flexible base substrate 50 using an open mask, wherein at least the display region 01 and the bonding region 03 are not blocked; and depositing the inorganic material in a way of low-temperature chemical vapor deposition (CVD). Since the display region 01 and the bonding region 03 are not blocked, the first inorganic layer 801 can be formed in the display region 01, and the third inorganic layer can be formed in the bonding region 03. Then the third inorganic layer is patterned to form the first stress relief sub-layer 701.

The process of forming the second inorganic layer 802 and the second stress relief sub-layer 702 via a patterning process is similar to the process of forming the first inorganic layer 801 and the first stress relief sub-layer 701, which will not be elaborated here.

It is noted that the methods of forming the first inorganic layer 801 and the first stress relief sub-layer 701 respectively via two patterning processes include: using an open mask to block at least the bonding region 03, and depositing the inorganic material in the display region 01 in a way of low-temperature CVD, thereby forming the first inorganic layer 801 in the display region 01; using another open mask to block at least the display region 01, depositing the inorganic material in the display region 03 in the way of low-temperature CVD, and forming the first stress relief sub-layer 701 having the via holes 200 described above via a photolithographic process. In addition, the methods of forming the second inorganic layer 802 and the second stress relief sub-layer 702 respectively via two patterning processes are the same as the methods described above, which will not be elaborated here.

Furthermore, if while the organic layer 803 is formed, an organic layer is formed in the bonding region 03, the organic layer serves as the third stress relief sub-layer 703 in the stress relief layer 70.

In this case, since the fabrication processes of the first stress relief sub-layer 701 and the first inorganic layer 801 may be partially the same, and/or, the fabrication processes of the second stress relief sub-layer 702 and the second inorganic layer 802 may be partially the same, the fabrication process of the flexible display substrate 10 may be simplified.

In some embodiments, the above manufacturing method further includes S301-S303.

In S300, a first inorganic layer 801 is formed on the conductive terminals 60.

In S301, an organic layer 803 is formed on the first inorganic layer 801.

In S302, a second inorganic layer 802 is formed on the organic layer 803.

The encapsulation layer 80 includes a first inorganic layer 801, an organic layer 803 and a second inorganic layer 802. The manufacturing process of the above encapsulation layer 80 is the same as that described above, which will not be elaborated here.

In some embodiments, the above S101 includes S303 and S304.

In S303, a third inorganic layer is formed in the bonding region 03, and the third inorganic layer is patterned to form the first stress relief sub-layer 701.

For example, an open mask is used for blockage during which the bonding region 03 is not blocked, and then the inorganic material is deposited in the way of low-temperature CVD. Since the bonding region 03 is not blocked, a third inorganic layer may be formed in the bonding region 03. Besides, the third inorganic layer is patterned to form the first stress relief sub-layer 701 having via holes 200.

In S304, a fourth inorganic layer is formed in the bonding region 03, and the fourth inorganic layer is patterned to form the second stress relief sub-layer 702.

The process of forming the second stress relief sub-layer 702 is similar to the process of forming the first stress relief sub-layer 701 described above, which will not be elaborated here.

The stress relief layer 70 may include only the first stress relief sub-layer 701. Since the stress relief layer 70 has the via holes 200 on positions corresponding to the Pad regions 04, the first stress relief sub-layer 701 has the via holes 200 on positions corresponding to the Pad regions.

In some other examples, the stress relief layer 70 may include only the second stress relief sub-layer 702. Since the stress relief layer 70 has the via holes 200 on positions corresponding to the Pad regions 04, the second stress relief sub-layer 702 has the via holes 200 on positions corresponding to the Pad regions.

In some other examples, the stress relief layer 70 may include a first stress relief sub-layer 701 and a second stress relief sub-layer 702. Since the stress relief layer 70 has via holes 200 on positions corresponding to the Pad regions 04, both the first stress relief sub-layer 701 and the second stress relief sub-layer 702 have via holes 200 on positions corresponding to the Pad regions 04.

It is noted that when the stress relief layer 70 includes the first stress relief sub-layer 701 and the second stress relief sub-layer 702, the third inorganic layer for forming the first stress relief sub-layer 701 and the fourth inorganic layer for forming the second stress relief sub-layer 702 may be simultaneously patterned to form the first stress relief sub-layer 701 and the second stress relief sub-layer 702 having the via holes 200 described above. Alternatively, the third inorganic layer for forming the first stress relief sub-layer 701 may be first patterned to form the first stress relief sub-layer 701 having the above via holes 200, and then the fourth inorganic layer for forming the second stress relief sub-layer 702 is patterned to form the second stress relief sub-layer 702 having the above via holes 200.

Furthermore, if while the organic layer 803 is formed, an organic layer is formed in the bonding region 03, the organic layer serves as the third stress relief sub-layer 703 in the stress relief layer 70.

In some embodiments, since the fabrication processes of the first stress relief sub-layer 701 and the first inorganic layer 801 may be partially the same, and/or, the fabrication processes of the second stress relief sub-layer 702 and the second inorganic layer 802 may be partially the same, the fabrication process of the flexible display substrate 10 may be simplified.

The above description is merely some embodiments of the present disclosure, but the protection scope of the present disclosure is not limited thereto. Any person skilled in the art could readily conceive of changes or replacement within the technical scope disclosed in the present disclosure, which should all be covered in the protection scope of the present disclosure. Therefore, the protection scope of the present disclosure shall be determined by the protection scope of the claims.

What is claimed is:

1. A flexible display substrate, comprising:

a flexible base substrate; and a plurality of conductive terminals and a stress relief layer which are arranged sequentially on the flexible base substrate, wherein the plurality of conductive terminals and the stress relief layer are disposed in a bonding region of the flexible base substrate, the bonding region comprises Pad regions, the stress relief layer is provided with via holes on positions corresponding to the Pad regions respectively, each via holes is used for exposing a conductive surface of a corresponding one of the plurality of conductive terminals, and the conductive surface is used for bonding an IC.

2. The flexible display substrate according to claim 1, wherein the flexible display substrate is divided into a display region and a non-display region located around the display region; and the bonding region is located in the non-display region;

the flexible display substrate further comprises metal wirings disposed in the display region, and the conductive terminals are connected to the metal wirings.

3. The flexible display substrate according to claim 2, wherein a material of the stress relief layer comprises an inorganic material.

4. The flexible display substrate according to claim 3, wherein the inorganic material comprises at least one of silicon nitride, silicon oxide or silicon oxynitride.

5. The flexible display substrate according to claim 2, wherein a thickness of the stress relief layer ranges from 0.1 μm to 1.0 μm.

6. The flexible display substrate according to claim 2, further comprising an encapsulation layer, wherein the encapsulation layer comprises at least one thin film layer, and the stress relief layer and at least one thin film layer in the encapsulation layer are in a same layer and of a same material.

7. The flexible display substrate according to claim 6, wherein the encapsulation layer comprises a first inorganic layer, a second inorganic layer and an organic layer disposed between the first inorganic layer and the second inorganic layer;

the stress relief layer and the first inorganic layer or the second inorganic layer are in a same layer and of a same material.

8. The flexible display substrate according to claim 6, wherein the encapsulation layer comprises a first inorganic layer, a second inorganic layer and an organic layer disposed between the first inorganic layer and the second inorganic layer;

the stress relief layer comprises a first stress relief sub-layer and a second stress relief sub-layer stacked on one another;

the first stress relief sub-layer and the first inorganic layer are in a same layer and of a same material, and the second stress relief sub-layer and the second inorganic layer are in a same layer and of a same material.

9. The flexible display substrate according to claim 2, further comprising a planarization layer and a touch layer disposed on the planarization layer, wherein the touch layer comprises a first touch electrode layer, a second touch electrode layer and an insulation layer disposed between the first touch electrode layer and the second touch electrode layer;

the stress relief layer, and the planarization layer or the insulation layer are in a same layer and of a same material.

10. The flexible display substrate according to claim 2, further comprising a planarization layer and a touch layer disposed on the planarization layer, wherein the touch layer comprises a first touch electrode layer, a second touch electrode layer and an insulation layer disposed between the first touch electrode layer and the second touch electrode layer;

and wherein the stress relief layer comprises a first stress relief sub-layer and a second stress relief sub-layer stacked on one another;

the first stress relief sub-layer and the planarization layer are in a same layer and of a same material, and the second stress relief sub-layer and the insulation layer are in a same layer and of a same material.

11. The flexible display substrate according to claim 9, further comprising a first connection pattern disposed on a side of the conductive terminal away from the flexible base substrate, the first connection pattern comprising a plurality of first connection portions each of which is electrically connected to a corresponding conductive terminal, wherein the first connection pattern and the first touch electrode layer or the second touch electrode layer are in a same layer and of a same material.

12. The flexible display substrate according to claim 9, further comprising a first connection pattern disposed on a side of the conductive terminal away from the flexible base substrate, the first connection pattern comprising a plurality of first connection portions each of which is electrically connected to a corresponding conductive terminal, wherein the first connection pattern comprises a first connection sub-pattern and a second connection sub-pattern that are stacked; and the first connection sub-pattern and the first touch electrode layer are in a same layer and of a same material, and the second connection sub-pattern and the second touch electrode layer are in a same layer and of a same material.

13. The flexible display substrate according to claim 2, further comprising a second connection pattern disposed between the conductive terminals and the stress relief layer, the second connection pattern comprising a plurality of second connection portions each of which is electrically connected to a corresponding conductive terminal.

14. The flexible display substrate according to claim 13, comprising gate lines and data lines, wherein the metal wirings are the gate lines, the conductive terminals and the gate lines are in a same layer and of a same material, and the second connection pattern and the data lines are in a same layer and of a same material; or the metal wirings are the data lines, the conductive terminals and the data lines are in a same layer and of a same material, and the second connection pattern and the gate lines are in a same layer and of a same material.

15. A flexible display device, comprising the flexible display substrate according to claim 1 and an IC, the IC having IC bumps, wherein the IC bumps contact conductive surfaces of conductive terminals of the flexible display substrate respectively.

16. The flexible display device according to claim 15, wherein an orthographic projection of each IC bump on the flexible base substrate is within a range of an orthographic projection of a border of a corresponding via hole of the stress relief layer on the flexible base substrate.

17. A method for manufacturing the flexible display substrate according to claim 1, the flexible display substrate having a bonding region comprising Pad regions, and the method comprising:

forming a plurality of conductive terminals disposed in the bonding region on the flexible base substrate; and forming a stress relief layer disposed in the bonding region on the flexible base substrate on which the conductive terminals have been formed, the stress relief layer being provided with via holes on positions corresponding to the Pad regions, each via holes being used for exposing a conductive surface of a corresponding conductive terminal, and the conductive surface being used for bonding an IC.

18. The method for manufacturing the flexible display substrate according to claim 17, wherein forming the stress relief layer comprises:

forming a first inorganic layer and a first stress relief sub-layer covering the plurality of conductive terminals via at least one patterning process on the flexible base substrate on which the conductive terminals have been formed;

forming an organic layer on the first inorganic layer via a single patterning process; and forming, on the organic layer, a second inorganic layer and a second stress relief sub-layer covering the plurality of conductive terminals via at least one patterning process, wherein the stress relief layer comprises the first stress relief sub-layer and/or the second stress relief sub-layer, and the encapsulation layer comprises a first inorganic layer, an organic layer and a second inorganic layer.

19. The method for manufacturing the flexible display substrate according to claim 17, further comprising:

forming a first inorganic layer on the conductive terminals;

forming an organic layer on the first inorganic layer; and forming a second inorganic layer on the organic layer, wherein the encapsulation layer comprises the first inorganic layer, the organic layer and the second inorganic layer;

and wherein forming the stress relief layer comprises:

forming a third inorganic layer in the bonding region, and patterning the third inorganic layer to form a first stress relief sub-layer; and forming a fourth inorganic layer in the bonding region, and patterning the fourth inorganic layer to form a second stress relief sub-layer, wherein the stress relief layer comprises the first stress relief sub-layer and/or the second stress relief sub-layer.

* * * * *